United States Patent [19]

Park

[11] Patent Number: 4,590,095
[45] Date of Patent: May 20, 1986

[54] NICKEL COATING DIFFUSION BONDED TO METALLIZED CERAMIC BODY AND COATING METHOD

[75] Inventor: Dong-Sil Park, Schenectady, N.Y.

[73] Assignee: General Electric Company, Schenectady, N.Y.

[21] Appl. No.: 740,377

[22] Filed: Jun. 3, 1985

[51] Int. Cl.⁴ .............................................. H05K 3/10
[52] U.S. Cl. ..................................... 427/96; 427/252; 427/253
[58] Field of Search ........................... 427/96, 252, 253

[56] References Cited

U.S. PATENT DOCUMENTS

| | | | |
|---|---|---|---|
| 3,061,462 | 10/1962 | Samuel | 427/253 |
| 3,198,659 | 8/1965 | Levy | 106/1.27 |
| 4,407,860 | 10/1983 | Fleming | 427/96 |
| 4,474,838 | 10/1984 | Halecky | 427/98 |
| 4,526,859 | 7/1985 | Christensen | 427/96 |

FOREIGN PATENT DOCUMENTS 52-53732  4/1977  Japan.
54-6974   4/1979  Japan .................................. 427/253

OTHER PUBLICATIONS

Kaiser et al., "A Fabrication Technique for Multilayer Ceramic Modules", Solid State Technology, May 1972, pp. 35–40.
Baudrand, "Electroless Nickel Plating on Metallized Ceramic", Plating & Surface Finishing, Sep. 1981, pp. 67–70.
Haddad et al., "Depositing Crack-Free Heavy Electroless Nickel Coating" IBM TDB vol. 20, No. 8, Jan. 1978.

Primary Examiner—John D. Smith
Attorney, Agent, or Firm—Jane M. Binkowski; James C. Davis, Jr.; James Magee, Jr.

[57] ABSTRACT

Pack cementation is used to diffusion bond substantially pore-free nickel to discrete exposed areas of tungsten or molybdenum that are in turn bonded to the surface of a ceramic body, e.g. in the preparation of a ceramic chip carrier.

17 Claims, 7 Drawing Figures

NICKEL COATING DIFFUSION BONDED TO METALLIZED CERAMIC BODY AND COATING METHOD

BACKGROUND OF THE INVENTION

This invention relates to nickel metallization in the preparation of semiconductor packaging devices, e.g. ceramic carriers employed in the packaging of semiconductor chips.

The increased performance and circuit/bit densities of today's semiconductor chips require corresponding technological advancements in chip packaging. Since the introduction of the leadless ceramic chip carrier, the chip carrier packaging concept has seen increasing use. Ceramic chip carriers typically make use of alumina-based substrates and have discrete areas of multi-layer metallization bonded to the ceramic substrate. These areas of metallization comprise in sequence (a) a base metallization layer of tungsten or molybdenum bonded to the ceramic substrate, (b) a layer of nickel bonded to the initial, or base, layer and (c) a layer of gold bonded to the nickel layer.

As a practical matter tungsten is the metal of choice for the base metallization although the use of molybdenum has been reported by one manufacturer for internal consumption.

In the typical fabrication of multi-layer ceramic substrates, alumina powder is mixed with glass frit and organic chemicals to form a slurry. This slurry is cast into sheets having a controlled thickness, which sheets are then blanked into various sizes and shapes, and via holes are punched. These green sheets are then screen printed with tungsten (or molybdenum) to form the base metallization. These metallized green sheets are stacked, and laminated together, followed by cofiring (i.e., sintering) in hydrogen or a hydrogen-nitrogen mixture with the heating schedule usually peaking at 1550° C.–1650° C. Thereafter, these sintered substrates are processed to apply nickel metallization over the exposed discrete areas of sintered tungsten or molybdenum. This is followed in turn by gold metallization of the nickel surfaces. Actual compositions of the slurry and specifics of the processing can be expected to vary from manufacturer to manufacturer.

The tungsten or molybdenum metallization is about 10 micrometers thick and is very porous. The nickel layer applied thereto is typically 2–5 micrometers thick, this layer being applied by electrolytic or electroless nickel plating. The thin layer of gold typically 1–2 micrometers thick is applied to accommodate die attachment, wire bonding and sealing. For good hermeticity (and for other reasons) it is important that the nickel and the gold metallizations contain as few pores as possible.

The sintered multi-layer ceramic bodies provided with the discrete areas of multi-layer metallization are subsequently subjected to brazing, chip joining and capping operations.

In existing ceramic chip carrier manufacture, nickel metallization is accomplished by the use of either an electrolytic or electroless plating process. A high purity nickel deposit generally can be obtained by electrolytic plating. It is well known, however, that this process has several major drawbacks including the following: (a) because of the need for an externally applied electrical current, it is often difficult to plate articles with complex shapes and circuitry; (b) for the same reason, the nickel coating is generally very nonuniform being thicker in well-exposed areas and substantially thinner at corners, and (c) the coating tends to be quite porous.

Because of these and other disadvantages of the electrolytic mode of plating, nickel metallization of ceramic chip carriers increasingly is carried out by electroless plating. This latter method can plate articles regardless of complexity of shape or circuitry with a relatively uniform coating thickness. Unlike electrolytically deposited nickel, however, electrolessly deposited nickel typically contains a high level (usually in excess of 1 wt. %) of boron or phosphorus. These impurities have been associated with the introduction of high internal stress in the coatings. U.S. Pat. No. 4,407,860—R. Fleming et al. discusses this problem and proposes a composition for the base metallization together with a post-coating treatment that purportedly provides stress-free pure nickel metallization.

Another concern in the use of electroless plating of nickel is the variability of the coating (e.g. thickness and completeness of coverage), which in large part is due to the extreme sensitivity of electroless nickel plating to the surface chemistry of the base metallization (tungsten or molybdenum). Still another concern is the limited selectivity of the coating, i.e., the coating often results in the deposition of nickel on the alumina substrate as well as on the tungsten. This latter problem, which is a source of electrical failure, can often be attributed to the presence of residue of a chemical, such as palladium chloride, used to activate the tungsten surface prior to applying the electroless nickel coating.

The over-all process of nickel metallization, whether by electrolytic or electroless plating, entails a great many steps. The reasons are basically as follows:

(a) a number of pre-cleaning steps (including acid and/or alkaline bath cleaning) are required, because of the sensitivity of the coating methods to the surface chemistry of tungsten, (b) in electroless plating several steps are required to activate the tungsten surface with a chemical, such as palladium chloride, and then to rinse off the excess chemical and condition the surface prior to nickel plating, (c) several more steps are required to promote adhesion of the nickel layer to the base metallization; this is often done by applying a first coating of nickel, heat-treating this coating at an elevated temperature to improve bonding to the tungsten, and then applying a second layer of nickel, and (d) a number of post-coating cleaning steps are required prior to gold plating to rinse off various chemical residues trapped in the pores and other defects in the nickel coatings.

It is, therefore, not uncommon to require 20–30 steps starting from the cofired chip carrier substrate to reach the stage at which the chip carrier is ready for application of the gold plating. It would be particularly advantageous to be able to eliminate such multiple-steps, which are cumbersome and costly. It would also be advantageous to reduce the incidence of pores in the nickel coatings and have them free of boron and phosphorus content.

By the process of nickel metallization of this invention, it is proposed to markedly reduce the processing time and cost of the nickel metallization, while simultaneously providing a superior reproducible nickel coating free of boron and phosphorus. Pack chromizing processes are known and used in industry primarily to produce chromium coatings to protect substrates, such as low carbon steel, against corrosion.

DESCRIPTION OF THE INVENTION

The coating process disclosed herein employs a pack cementation process conducted at elevated temperature for a suitable time in the presence of a chemical activator. The ceramic substrate bearing the initial metallization of tungsten (or molybdenum) in discrete exposed areas is first cleaned to degrease and remove dirt in a simple process, as by ultrasonic cleaning in alcohol. The cleaned ceramic metal substrate is fully embedded in a pack mixture of nickel powder, chemical activator and an inert filler all contained in a suitable workboat. Typically a chemical activator would be selected from the group consisting of ammonium iodide, ammonium chloride and ammonium bromide. A suitable inert filler would be alumina powder. The workboat containing the ceramic metal substrate and the pack mixture is then heated in a non-oxidizing atmosphere to an elevated temperature for a pre-determined period of time to accomplish the nickel metallization. Thereafter the workboat and its contents are permitted to cool.

The resulting coating of nickel over each of the previously exposed metallized areas of tungsten or molybdenum is of unusually high quality in that at the underside of each such nickel coating it is well bonded (i.e. diffusion bonded) to the underlying metal, the nickel coating itself is substantially or completely free of porosity and the nickel surface is uniformly smooth with a high degree of flatness. The operating condition favoring the effective diffusion bond also promote the diffusion of metal atoms through the nickel layer to its surface. Depending upon the temperature/time relationship employed the tungsten (or molybdenum) content at the surface of the nickel layer can be expected to vary from about 0.1 wt. % to about 10 wt. %. Particularly important is the fact that the nickel coating is free of boron and phosphorus.

The coating rate for the deposition of the nickel is very high and the process in toto is much simpler than prior art processes. Specifically, in contrast to the prior art nickel metallization processes, in the process of this invention there is no need for multiple pre-cleaning steps, activation steps or post-coating sintering steps thereby obviating the cumbersome and costly procedures required in the prior art. The primary consequence flowing from this simplified process is the potential reduction in manufacturing cost provided thereby. A secondary consequence is the potential of producing a nickel coating superior to the nickel coatings obtainable from electrolytic or electroless plating processes.

Alternatively, instead of depositing the entire thickness of nickel desired by the pack cementation process, a thin layer of nickel can be applied by this process and then this layer can be brought to the desired thickness by a prior art plating method.

BRIEF DESCRIPTION OF THE INVENTION

The features of this invention believed to be novel and unobvious over the prior art are set forth with particularity in the appended claims. The invention itself, however, as to the organization, method of operation and objects and advantages thereof, may best be understood by reference to the preceding and to the following description taken in conjunction with the accompanying drawings wherein:

Figure 3:
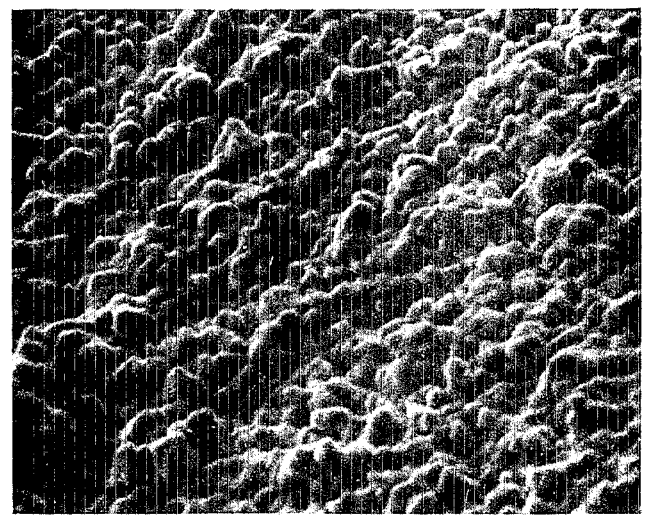
Figure 4:
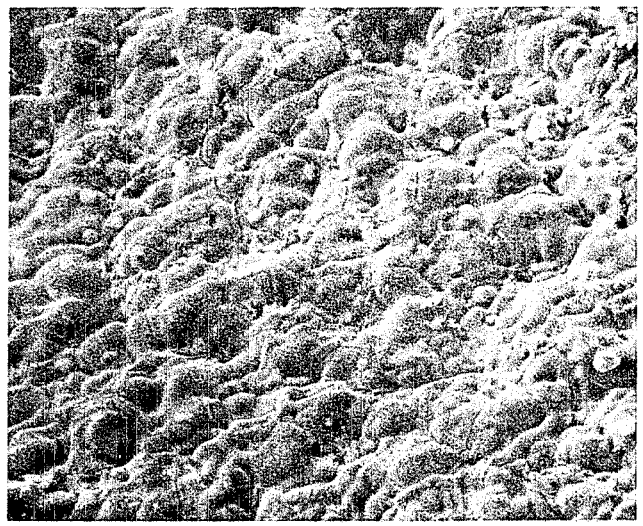
Figure 5:
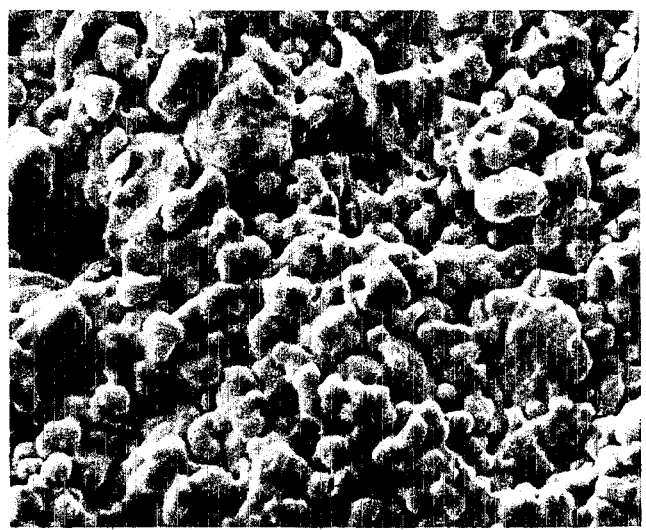
Figure 6:
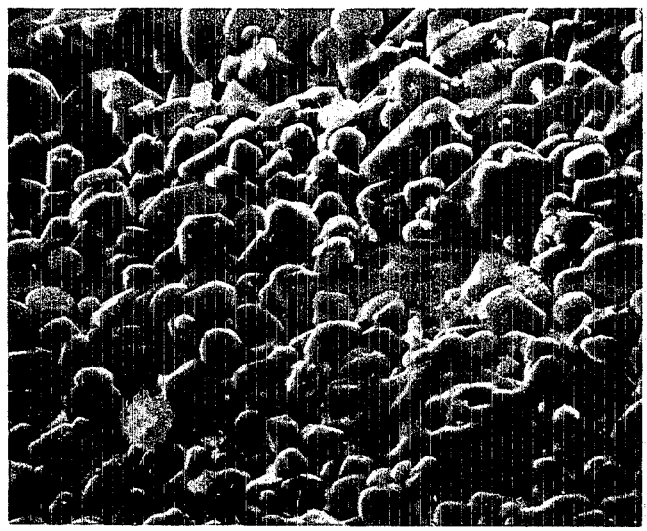
Figure 7:
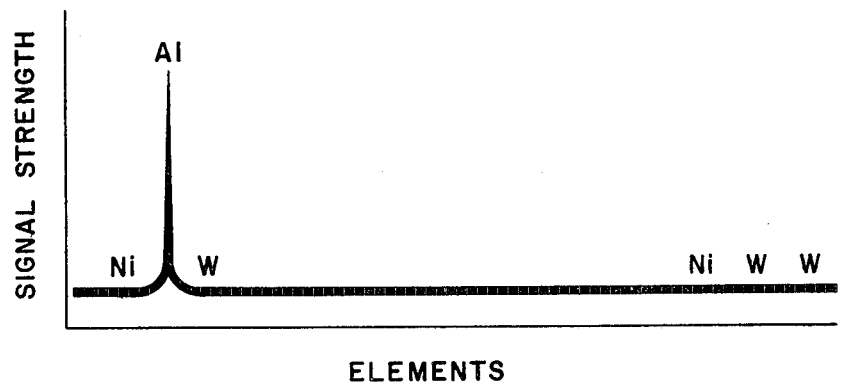

FIGS. 3, 4 and 5 are 2000× SEMs showing the surface of the nickel coating obtained using a series of pack mixtures containing 30 wt. % nickel, 10 wt. % nickel and 2 wt. % nickel, respectively;

FIG. 6 is a 2000× SEM showing the exposed (i.e. unmetallized) ceramic surface of a chip carrier that has been subjected to this pack cementation process and FIG. 7 is a graphic reproduction of an energy dispersive spectroscopy (EDS) scan of the surface in FIG. 6 showing that this ceramic surface remained free of nickel.

MANNER AND PROCESS FOR MAKING AND USING THE INVENTION

Although the following description makes reference to the base metallization layer (i.e. the layer bonded directly to the ceramic) as being tungsten, this invention is equally applicable to the use of molybdenum as the base metallization layer with similar results.

Referring now to the drawings, the stacked, laminated and partially metallized ceramic body 10 is an incomplete chip carrier in that the final metallization layer (i.e. the gold) has not been deposited. The semiconductor chip (not shown) to be housed in chip carrier 10 would be mounted and soldered into place in recess 11. The ceramic material typically used is alumina containing 5–10% glass. The tungsten metallization, which is applied as areas having various configurations by screen printing to the green sheets prior to stacking and laminating remain partially exposed after the lamination. The tungsten metallization layers, such as are represented by numerals 12, 13, 14, 16, and 17 are present as discrete areas interconnected as required for the particular circuitry. The tungsten metallization resulting from the sintering step is bonded to the ceramic, is about 10 micrometers thick and is very porous.

The nickel metallization according to this invention is accomplished by fully embedding the sintered, laminated, tungsten-metallized ceramic body in a pack mixture of nickel powder, a chemical activator (such as ammonium iodide) and an inert filler (e.g. alumina powder), all contained in a suitable workboat. The workboat containing the ceramic body and the pack mixture is heated in an atmosphere of inert gas to a temperature in the range of from about 650° C. to about 1000° C. for a predetermined period of time ranging from a few minutes to as much as two hours and then permitted to cool. In the preferred process the temperature used is in the range of from about 800° C. to about 900° C. for a time ranging from about 5 minutes to about 30 minutes.

Figure 1:
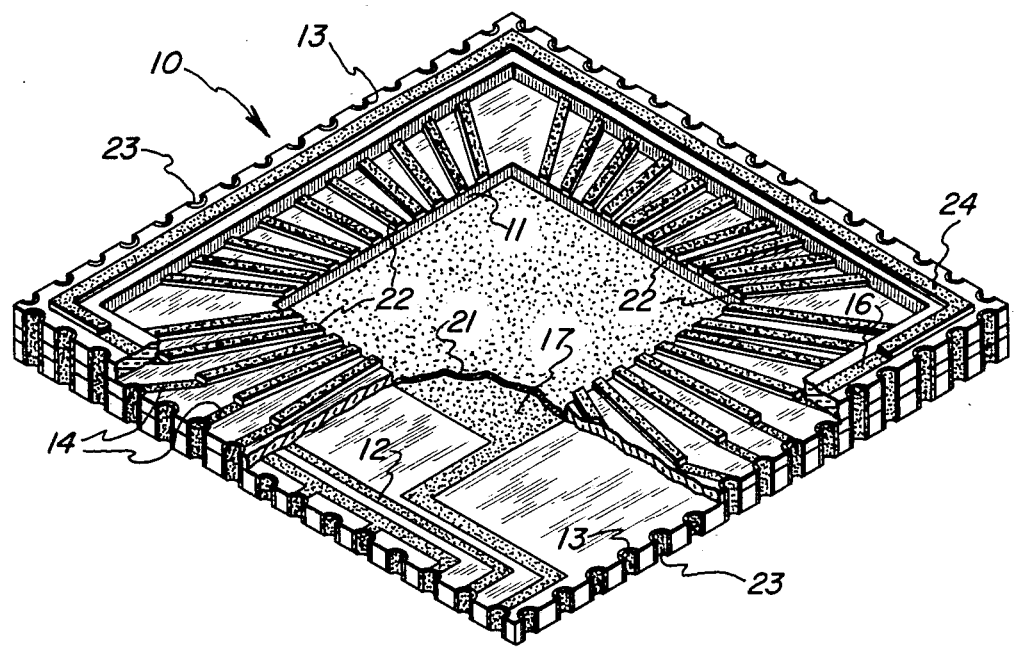
FIG. 1 is a schematic three dimensional view of a simple multi-layer ceramic chip carrier partly cut away to show the initially applied discrete areas of metallization, the exposed portion of which (after assembly and sintering of the green sheets) have each received a nickel overlay ready for the application of the subsequent layer of gold.

The ceramic body upon completion of this treatment is as is represented in FIG. 1, the nickel metallization layers 21, 22, 23 and 24 having been deposited and diffusion bonded to the underlying porous tungsten layers. Thus, after separation of the metallized ceramic substrate from the particulate pack mixture, each of the previously exposed areas of tungsten (and only these areas) will have received a high quality coating of nickel diffusion bonded thereto, the thickness of which is related to the pack mixture composition and the time/temperature exposure.

Using ammonium iodide as the activator, the coating chemistry can be explained briefly as follows. During heating of the ceramic body and pack mixture ammonium iodide decomposes to generate ammonia, hydrogen iodide (HI) and some nitrogen and hydrogen. The hydrogen iodide reacts with nickel to form nickel iodide. At a higher temperature, the nickel iodide vaporizes, moves to the exposed surfaces of tungsten and deposits nickel. This deposition can occur by exchange of nickel with tungsten (Reaction 1 below), by hydrogen reduction (Reaction 2), or by thermal decomposition (Reaction 3)

By its nature, the deposition of nickel by reaction (1) is selective, i.e., it occurs only on tungsten. Deposition of nickel by reaction (2) or (3) is not necessarily selective, i.e., it would be expected to occur on the alumina substrate as well as on the tungsten. Unexpectedly, as will be described hereinafter, nickel deposition by the process of this invention displays excellent selectivity under proper coating conditions. This apparently occurs because reactions (2) and (3) are catalyzed by the tungsten.

Another benefit of the process of this invention is the in-situ cleaning effects that occur. Thus, the high temperature of the process produces burnout of any residual organic materials present; in-situ generated hydrogen reduces oxides that might have been present on the surface of the articles to be coated and HI formed will exert a cleansing effect.

An effect of the high temperature exposure occurring during this process is the diffusion of tungsten into the nickel layer so that the composition of the nickel layer will be nickel plus at least 0.1 wt. % tungsten. Although the diffusion so produced produces desired bonding between these two layers, it is preferred to keep the amount of tungsten diffusing through the nickel at, or near, the 0.1 wt. % level.

Figure 2:
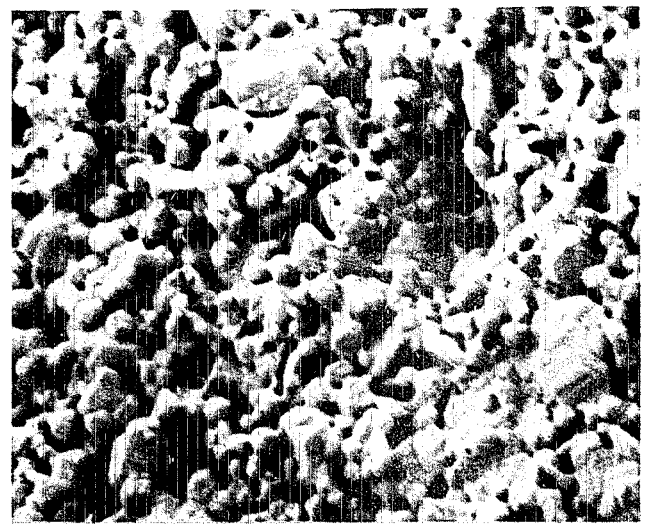
FIG. 2 is a 2000× scanning electron micrograph (SEM) showing the surface of a typical cofired porous tungsten layer prior to application of the nickel metallization.

FIG. 2 is a 2000× SEM showing the porous nature of the sintered tungsten metallization. The quality of the final nickel surface applied by this process over this porous tungsten even for nickel layers of thicknesses of several micrometers is surprisingly good.

Compositions in the following examples are all given listing the components by weight percent. The term "uniform" as used herein carries a double connotation; thus, on a macroscopic scale (e.g. appearance) the term indicates overall uniformity in thickness of the layer deposited while on a microscopic scale the term means substantial freedom from porosity.

EXAMPLE 1

A ceramic chip carrier with tungsten metallization in place was ultrasonically cleaned in isopropyl alcohol for one minute. It was then completely embedded in a pre-mixed pack of 30% by weight of nickel powder (−325 mesh), 3% $NH_4I$, and the balance alumina powder (Alcoa A15, −325 mesh), contained in a cylindrical workboat made of 304 stainless steel. The workboat with the chip carrier was then heated to 850° C. for one hour in a flowing stream of argon maintained at 2 SCFH. After cooling the workboat to about 50° C., the chip carrier was removed from the pack, and was cleaned in flowing distilled water at room temperature followed by further cleaning ultrasonically in alcohol. The result was a chip carrier with a uniform nickel metallization. In further analysis, the coating (about 7.8 milligrams/cm$^2$) was found to be of a very high quality, being essentially porefree and relatively uniform in appearance as illustrated in FIG. 3. Compared to the original tungsten surface, shown in FIG. 2, the nickel coating (about 8.6 micrometers thick) shows hardly any porosity.

EXAMPLE 2

A tungsten-metallized chip carrier sample was coated with nickel by pack cementation in a manner similar to that of Example 1, but using a pack mixture of 10% Ni, 1% $NH_4I$ and the balance alumina powder at 900° C. for 30 minutes. The result was again a chip carrier with a uniform coating of nickel of high quality as illustrated in the FIG. 4 SEM. The chip carrier had a weight gain of 5.8 mg/cm$^2$ of tungsten surface or an effective nickel thickness of 4.1 μm.

EXAMPLE 3

A tungsten-metallized chip carrier sample was coated with nickel by pack cementation in a manner similar to that of Example 1, but using a pack mixture of 2% Ni powder, 0.2% $NH_4I$ and the balance alumina powder. The workboat and its contents were heated to 900° C. for 30 minutes. The result was a chip carrier with a visually uniform nickel coating over each previously exposed area of tungsten. Because of the low pack concentration, the nickel weight gain was low at 0.54 mg/cm$^2$, which is equivalent to an effective thickness of 0.6 μm. As is illustrated in FIG. 5, the coating was not thick enough to be fully pore-free. It should be noted, however, that even such a thin nickel coating drastically reduced the porosity present in the original tungsten metallization (FIG. 2).

EXAMPLE 4

A tungsten-metallized chip carrier sample was coated with nickel by pack cementation in a manner similar to that of Example 2 using a pack mixture of 10% Ni, 1% $NH_4I$ with the balance alumina powder and heating to about 900° C. for 30 minutes. Instead of using an argon atmosphere, however, the workboat with its contents was heated in nitrogen through the entire thermal cycle. The result was a chip carrier with a uniform, high quality nickel coating on the previously exposed tungsten. The weight gain and coating morphology were essentially identical to those of coatings made in an argon atmosphere under otherwise similar conditions, e.g., Example 2. The fact that nitrogen can be used for nickel coating by pack cementation is important for its cost-saving aspect.

EXAMPLE 5

A nickel-metallized chip carrier prepared as in Example 1 was cleaned in flowing distilled water and then subjected to ultrasonic cleaning in alcohol. Gold was deposited on the nickel surfaces by electroless plating without further preparatory treatment yielding high quality gold coatings.

This gold plating was successfully repeated with other chip carrier substrates on which nickel was deposited by the process of this invention using a variety of deposition conditions (i.e. temperature, time, pack concentration, etc.).

EXAMPLE 6

A tungsten-metallized chip carrier sample was coated with nickel by pack cementation in a manner similar to that of Example 1 using a pack mixture of 10% Ni(Inco 255), 2% NH$_4$I with the balance alumina powder (Alcoa A14 UG) contained in a workboat made of nickel, and heating to about 800° C. for 30 minutes. Instead of using a pure argon atmosphere, however, the workboat with its content was heated in an argon-10% hydrogen mixture through the entire thermal cycle. The result was a chip carrier with a uniform, high quality nickel coating on the previously exposed tungsten. The weight gain was about 2.8 mg/cm$^2$ of tungsten surface or an effective nickel thickness of 3.1 μm.

EXAMPLE 7

In an experiment to examine the effect of precleaning on the deposition rate and quality of nickel produced by the method of this invention, three nominally identical tungsten-metallized chip carrier samples were subjected to different pre-cleaning steps as follows: (a) the control sample was cleaned ultrasonically in alcohol for one minute, (b) a second sample did not have any cleaning at all, i.e., the surface was in the as-sintered condition, and (c) a third sample was subjected to thermal cleaning at 850° C. for 30 minutes in a mixture of argon-10% hydrogen and was then cooled to room temperature.

These three samples were then coated with nickel in a manner similar to that of Example 6 using a pack mixture of 10% Ni, 2%NH$_4$I with the balance alumina powder and heating to about 850° C. for 10 minutes in a nitrogen atmosphere. The result in each case was a chip carrier with a uniform, high quality nickel coating on the previously exposed tungsten. The weight gains were 3.6, 3.9 and 3.7 mg/cm$^2$ of tungsten surface for the control sample, the one without any pre-cleaning and the one with 850° C. pre-cleaning, respectively. The morphology of the coatings was essentially identical.

While it is desirable to use pre-cleaning, e.g., ultrasonic cleaning in alcohol, to get rid of material such as dust, the results of this experiment clearly demonstrate the simplicity of the pre-cleaning requirements for nickel coating by the process of this invention compared to the cumbersome multiple cleaning steps required in electroless or electrolytic nickel plating methods.

For a nickel coating method to be able to be used for chip carriers and other packaging applications, the nickel deposition should occur only on the exposed tungsten and not on the alumina-based substrates. Detailed analysis has shown that the nickel coatings applied by the present pack cementation method are very selective, i.e., nickel deposition occurs only on the tungsten, when the coating parameters are properly controlled. This point is illustrated in FIGS. 6 and 7 in which the SEM and EDS scan, respectively, show the nickel-free alumina surface of the chip carrier sample of FIG. 3. Because of this unpredictably excellent selectivity, in each of the foregoing examples the effective thickness of nickel layer was calculable from the weight gain of nickel and the area of the tungsten metallization.

In other experiments to determine the effects of certain processing variables, excellent coatings have been obtained with a wide range of these variables, e.g., for temperature (750°–950° C.), for time (1–120 minutes) and for different workboat materials (pure nickel, alumina, stainless steel). Alumina powders and nickel powders from various commercial sources have been successfully used. Also, good coatings have been obtained with NH$_4$Cl or NH$_4$Br as an activator even though the weight gain is lower than for NH$_4$I. Excellent nickel coatings have also been obtained on pure tungsten foils and on pure molybdenum foils.

As is established in the preceding examples the nickel deposition by pack cementation has been successfully accomplished using argon, nitrogen and argon plus 10 vol. % hydrogen environments. It is expected that hydrogen and nitrogen plus hydrogen environments will also provide operative environments.

What is claimed is:

1. A process for the nickel metallization of discrete exposed tungsten metal- or molybdenum metal-covered areas bonded to a ceramic substrate comprising the steps of:
   (a) cleaning said ceramic substrate and metal-covered areas,
   (b) embedding said cleaned ceramic substrate in a mixture of nickel powder, powdered activator and particulate inert filler located in a container,
   (c) heating said container and its contents in an non-oxidizing environment at a temperature in the range of from about 650° C. to about 1000° C. for a period of time ranging from about 1 minutes to about 120 minutes and
   (d) removing said ceramic substrate from said container, said discrete metal-covered areas each having a coating of nickel diffusion-bonded thereto.

2. The process of claim 1 wherein the non-oxidizing environment is argon.

3. The process of claim 1 wherein the non-oxidizing environment is nitrogen.

4. The process of claim 1 wherein the non-oxidizing environment is argon plus hydrogen.

5. The process of claim 1 wherein the non-oxidizing environment is hydrogen.

6. The process of claim 1 wherein the non-oxidizing environment is nitrogen plus hydrogen.

7. The process of claim 1 wherein the discrete metal-covered areas are areas of tungsten.

8. The process of claim 1 wherein the discrete metal-covered areas are areas of molybdenum.

9. The process of claim 1 wherein the temperature is in the range of about 800° C. to about 900° C. and the time period is in the range of from about 2 to about 30 minutes.

10. The process of claim 1 wherein the concentration of nickel ranges from about 5 to about 20 wt. %.

11. The process of claim 1 wherein the concentration of activator is in the range of from about 0.5 to about 4 wt. %.

12. The process of claim 1 wherein the activator is selected from the group consisting of ammonium iodide, ammonium chloride and ammonium bromide.

13. The process of claim 12 wherein the activator is ammonium iodide.

14. The process of claim 1 wherein the activator is ammonium iodide.

15. The process of claim 1 wherein the particulate inert filler is alumina.

16. The process of claim 1 wherein the entire cleaning consists of ultrasonic cleaning in an organic solvent.

17. The process of claim 16 wherein the organic solvent is alcohol.

* * * * *